United States Patent [19]
McCarthy

[11] Patent Number: 5,760,443
[45] Date of Patent: Jun. 2, 1998

[54] SILICON ON INSULATOR WITH ACTIVE BURIED REGIONS

[75] Inventor: Anthony M. McCarthy, Menlo Park, Calif.

[73] Assignee: Regents of the University of California, Oakland, Calif.

[21] Appl. No.: 547,080

[22] Filed: Oct. 23, 1995

Related U.S. Application Data

[62] Division of Ser. No. 137,412, Oct. 18, 1993, Pat. No. 5,488,012.

[51] Int. Cl.⁶ .................................................. H01L 21/76
[52] U.S. Cl. ................................... 257/347; 257/352
[58] Field of Search ............................. 257/347, 352, 257/353, 354, 57, 59, 61, 66, 69, 72

[56] References Cited

U.S. PATENT DOCUMENTS 4,279,688  7/1981  Abrahams et al. ............... 257/352
4,880,753  11/1989  Meakin et al. .................. 257/347

*Primary Examiner*—Tom Thomas
*Assistant Examiner*—David B. Hardy
*Attorney, Agent, or Firm*—L. E. Carnahan; Henry P. Sartorio

[57] ABSTRACT

A method for forming patterned buried components, such as collectors, sources and drains, in silicon-on-insulator (SOI) devices. The method is carried out by epitaxially growing a suitable sequence of single or multiple etch stop layers ending with a thin silicon layer on a silicon substrate, masking the silicon such that the desired pattern is exposed, introducing dopant and activating in the thin silicon layer to form doped regions. Then, bonding the silicon layer to an insulator substrate, and removing the silicon substrate. The method additionally involves forming electrical contact regions in the thin silicon layer for the buried collectors.

11 Claims, 2 Drawing Sheets

SILICON ON INSULATOR WITH ACTIVE BURIED REGIONS

This is a division of application Ser. No. 08/137,412 filed Oct. 18, 1993, now U.S. Pat. No. 5,488,012.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the manufacture of silicon on insulator wafers, particularly to forming buried components, such as collectors, in such wafers, and more particularly to forming buried components in silicon-on-glass wafers and providing electrical contacts to the buried collectors using excimer laser technology.

Silicon-on-insulator (SOI) technologies have advanced dramatically in recent years towards the goal of producing thin single-crystal silicon (SCS) films on insulated substrates. Components such as metal-oxide-semiconductor transistors, fabricated in SOI films have the potential for increased mobility, reduced parasitic capacitance and leakage current as well as improved radiation hardness due to reduced junction sidewall area and elimination of bottom junction area. To date, there has been no success in achieving single-crystal silicon device fabrication on less expensive glass substrates capable of withstanding temperatures up to 600° C. Others have achieved this with expensive glasses, such as Corning 1729 using 800° C. (see L. J. Spankler et al., "A Technology for High-Performance Single-Crystal Silicon on Insulator Transistors", IEEE Electron Device Letters, Vol. 13, No. 4, Apr. 1987, pp. 137–139) and Corning 1733 at 600° C. with compromises (see U.S. Pat. No. 5,110,748 issued May 5, 1992 to K. Sarma). SOI transistors on glass substrates are particularly attractive for sensors and displays, although many other applications are possible such as actuators, high temperature electronics, optoelectronics, and radiation hard electronics.

A wide variety of techniques have been proposed for realizing thin silicon films compatible with high-performance devices on an insulating substrate. Due to the high temperature processing requirements of silicon (greater than 800° C.), silicon-on-glass substrate processing has not been possible except on the so-called "high-temperature" glass, such as expensive Corning 1729 glass, capable of withstanding greater than 800° C. temperatures. Other glasses used in commercial applications, such as lap-top displays, cannot withstand temperature exposures greater than 600° C., such as the Corning 7059 or other "low-temperature" glasses. Due to the high temperatures of silicon processing, conventional techniques have relied on amorphous (a-Si) and polycrystalline (p-Si) materials which can be doped and treated at temperatures that the glass can withstand, but whose performance is decidedly inferior to crystalline films. These prior approaches to forming silicon-on-insulator substrates are exemplified by U.S. Pat. No. 5,013,681 issued May 7, 1991 to D. J. Godbey et al. and the following articles: "Nanosecond Thermal Processing For Ultra-High-Speed Device Technology", T. W. Sigmon et al., Materials Research Society Symp. Proc., Vol. 158, 1990, pp. 241–153; and "Low-Temperature Fabrication of p+-n Diodes with 300Å Junction Depth", K. H. Weiner et al., IEEE Electron Device Letters, Vol. 13, No. 7, Jul. 1992, pp.369–371.

Recently, a method has been developed for producing silicon microelectronics on glass substrates. However, this recent method utilizes laser activation for forming the doped and activated regions after thin silicon film formation and may optionally use etch stops between silicon layers and laser melting to smooth the silicon surfaces, and which is described and claimed in copending U.S. Application Serial No. 08/137,401, filed Oct. 18, 1993, entitled "A Method For Forming Silicon On A Glass Substrate", and assigned to the same assignee.

As pointed out above, there are substantial advantages for forming components, such as metal-oxide-semiconductor and bipolar transistors, on the SOI (silicon-on-glass) substrates. For this purpose there has been a need for a method for effectively forming buried components in SOI substrates. The present invention fills that need. Basically, the present invention is directed to a method for introducing the buried components (collectors for example) prior to bonding the silicon to the glass substrate by masking the silicon surface to form a desired pattern and, performing implantation, whereafter the silicon is bonded to the insulator (glass), or oxidized silicon substrate. The present invention additionally provides for the formation of electrical contact regions to the buried components by masking the silicon layer after it is bonded to the insulator, and laser melting regions of the silicon layer which contact the buried components.

SUMMARY OF THE INVETION

It is an object of the present invention to provide buried components in silicon-on-insulator substrates.

A further object of the invention is to provide a method for forming buried components in silicon-on-insulator wafers.

Another object of the invention is to provide a method for forming electrical contacts for buried components.

Another object of the invention is to provide a method for introducing patterned buried components in SOI wafers using an excimer laser doping technique.

Another object of the invention is to provide a method for forming contacts to the buried components in silicon-on-glass substrates using laser doping techniques.

Other objects and advantages will become apparent from the following description and accompanying drawings. The invention basically involves a method for introducing patterned buried components in a silicon layer and forming contacts for the buried components in the thin silicon layer after fabrication of the SOI. These features may be accomplished using excimer laser doping techniques during the formation of the SOI and after the SOI has been fabricated. This method is directly applicable to SOI wafers made from a silicon wafer bonded to a substrate such as glass or an oxidized silicon wafer. This invention is particularly applicable for producing component embedded SOI substrates for sensors and displays requiring an optically transparent substrate.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Figure 1:
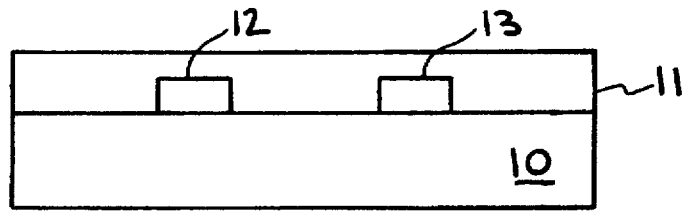
FIG. 1 is an embodiment of a silicon-on-glass wafer with buried components as made in accordance with the present invention.
Figure 2:
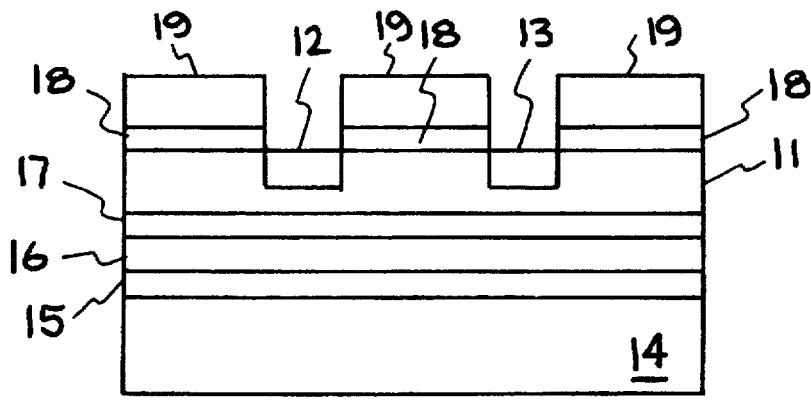
FIGS. 2–6 illustrate an example of the operational sequence of the fabrication method for producing the FIG. 1 wafer in accordance with the present invention.
Figure 3:
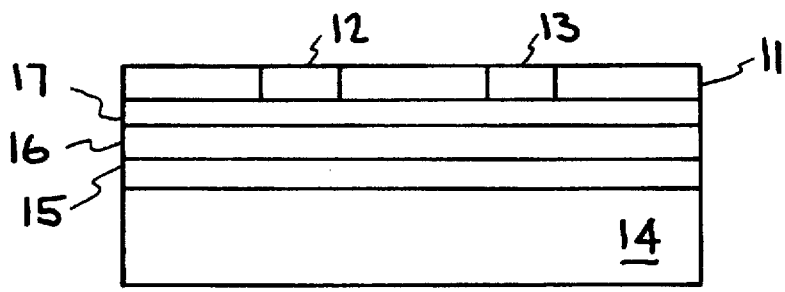
Figure 4:
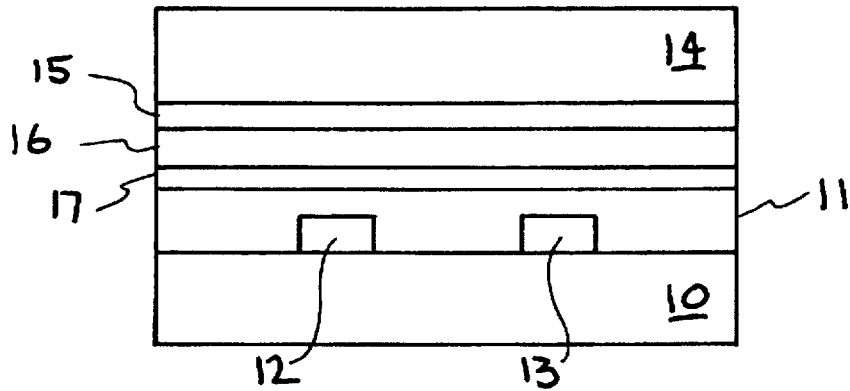
Figure 5:
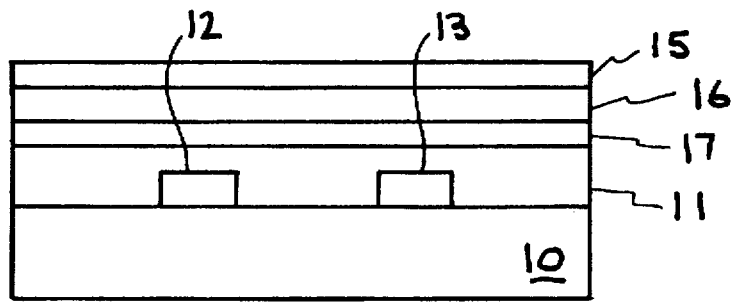
Figure 6:
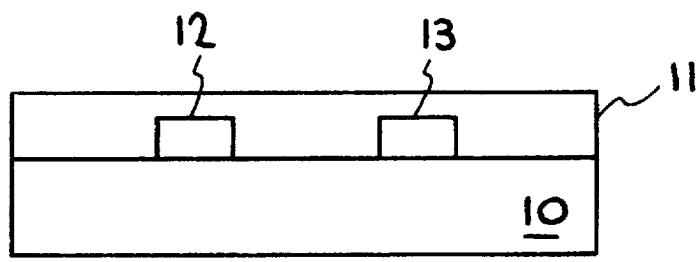
Figure 7:
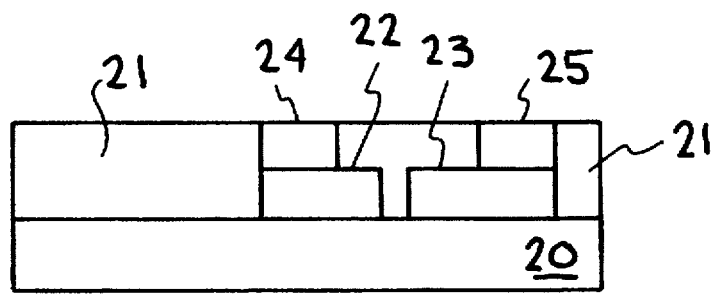
FIG. 7 illustrates an embodiment of a silicon-on-glass wafer with buried components and electric contacts as made in accordance with the present invention.

The present invention involves performing dopant redistribution using a laser melting technique on silicon-on-insulator material for forming buried components and electrical contacts for the buried components. The present invention utilizes the method for forming a thin film or layer of silicon on an insulated substrate as described and claimed in the abovereferenced copending U.S. application Ser. No. 08/137,401, but additionally, components may be introduced by implantation or by laser melting in a dopant environment in the silicon wafer prior to the silicon-on-glass formation process, as illustrated in FIG. 1. In addition, and after the buried components are formed, the invention provides electrical contacts for the buried components by silicon laser melting, as illustrated in FIG. 7. The method of the above-referenced copending application is incorporated herein by reference thereto.

The method of this invention modifies the fabrication process of the above-identified copending application by forming doped components, such as collectors, sources, drains, etc. in a surface of the silicon layer prior to that layer being bonded to the glass wafer or substrate, such that when the silicon or handle wafer and the etch stop layers are removed, the doped components are buried in the silicon film or layer. The method of this invention is intended to include, if desired, the use of plural alternating silicon and doped etch stop layers, as well as the use of a thin dielectric layer, or layers, in combination with a metal layer(s), between the glass substrate and the thin silicon layer, as described and illustrated in the above-identified copending application, but for simplicity of description only a double thin silicon and double doped etch stop layers are described and illustrated herein.

FIG. 1 illustrates an embodiment of a silicon-on-glass wafer with buried components, such as collectors, in the thin silicon layer. As seen in FIG. 1, a glass wafer 10 has a thin layer or film 11 secured thereto, such as by anodic or furnace bonding, and within which are buried components, such as collectors, indicated at 12 and 13. By way of example, the glass wafer 10 may have a thickness over about 4 mils, the silicon layer 11 may have a thickness of 200Å to 2 microns, with the buried components 12 and 13 having a thickness of 100Å to 1 micron. While not shown, a thin (thickness of 100Å to 1 micron) dielectric layer (silicon nitride, silicon dioxide, and silicon oxynitrides) may be located between the glass wafer 10 and the silicon layer 11/buried components 12 and 13, as described and illustrated in the above-identified copending application, to prevent any contamination from the glass wafer.

FIGS. 2–6 illustrate the various stages of an example of the method of this invention for producing the FIG. 1 embodiment. This example of the method is set forth as follows:

1. A silicon wafer or substrate 14 having a thickness of about 0.1–1.5mm and having a (100) orientation is used as the starting substrate.

2. A boron doped first etch stop, layer 15, is formed on the silicon wafer with a boron level exceeding 5e19/cm$^3$. Typical means of forming this layer are implantation, epitaxy or liquid source doping in a furnace at temperatures in excess of 750° C. The thickness of the layer is determined by the selectivity of the etching technique subsequently used to remove the silicon wafer. In this example a liquid source doped boron layer, about 3 microns of which exceeded the required doping level was used.

An intermediate silicon layer, 16, is epitaxially grown on the silicon surface. In this example the thickness of layer 16 was 1.5 microns. A suitable thickness of layer 16 exceeds 0.5 microns.

A second etch stop layer 17 may be an epitaxially grown boron doped silicon layer or a silicon-germanium layer. If a boron doped layer is used the thickness required exceeds about 500Å and the doping density will exceed about 5e19/cm$^3$.

In the event a silicon-germanium (SiGe) epitaxial layer 17 is used, it should have a thickness of about 100–1500Å. Doping may be used in the SiGe layer but is not necessary to achieve adequate etch stop properties. The SiGe layer may have between 1 and 50% Ge. An undoped thickness of about 500Å is usually sufficient. In experimental efforts 10–25% layers have been used.

3. An epitaxial layer 11 of device quality silicon, thickness of 0.01 1μm, is epitaxially deposited on the etch stop layer 17 (see FIG. 2).

4. The silicon layer 11 may be implanted with the desired dopant species to form the regions 12 and 13, and then activated at a temperature of over 600° C. (see FIG. 2). The etch stop material (SiGe) will normally sustain short anneals in the temperature range of 600° C.–800° C. without adverse effects.

A low temperature oxide deposition, layer 18, is used to separate a dopant masking material 19 from the silicon surface. The dopant masking material 19 is a photoresist in the case of implantation and a metal in the case of laser doping. The dopant masking material 19 and oxide layer 18 are removed after dopant introduction in the silicon layer 11 and prior to furnace activation if implantation is performed. In the case of laser doping no furnace activation is required. Among other forms of introducing and activating the dopant are: implantation followed by laser melting and recrystallization or rapid thermal anneal, and photolytic gas decomposition followed by rapid thermal anneal.

5. Selecting and cleaning a glass wafer (Corning 7740 glass) such as wafer 10 having a thickness of greater than 4 mils.

6. Depositing, if desired, a thin layer (thickness of 100Å to 1 micron) of dielectric material, not shown, such as silicon nitride, silicon dioxide or silicon oxynitrides, on the surface of glass wafer 10 or over layer 11 on silicon wafer 14, by plasma enhanced chemical vapor deposition at temperatures in the range of 100–400° C. using gases such as the derivatives of silane to provide the silicon, and ammonia to provide nitrogen and oxygen. These materials are slightly conductive due to the presence of as much as 1–25% hydrogen in the films and thus permit anodic bonding of the glass to the silicon layer or wafer, and function to prevent diffusion of alkalis from the glass wafer into the thin silicon layer.

7. Anodic bonding the thin silicon wafer 14 to the glass wafer 10, see FIG. 4, by cleaning the glass substrate and the prepared silicon wafer and placing them together in a heated environment at between 270°–800° C., while directing a voltage in the range of 100–5000V across the two substrates, the glass being the cathode. Other techniques for securing the silicon layer 11 to glass wafer 10 include eutectic bonding and gluing. Corning 7740 is a common glass in use due to its ease of anodic bonding with silicon in a temperature range of 270 20 –590° C., and a voltage range of 100–2000V. Other glasses that may be used are Corning 1726, 1733 and 7050. The term bonding as used herein is intended to include the technique by which the silicon layer is secured to the insulator substrate.

8. The silicon wafer substrate 14 is removed by polishing and/or wet/dry etching techniques. Polishing, using a diamond containing slurry, is used to grind down the silicon wafer to a thickness of 100–200μm followed by a wet or dry etch to complete removal of the silicon wafer. A wet etch of a 3:1 $H_2O$/KOH was used at 80° C., although typical $H_2O$/KOH compositions consist of 1:1–5:1. The time period of wet etching in this example was 8 hours. If desired, for the final 30μm of the silicon wafer etch, Isopropanol (ISO) may be added to the $H_2O$/KOH solution in excess of solubility to provide a very sensitive etch stop. For example, a solution of 2:6:1 KOH:$H_2O$:ISO at 60° C. may be used. The etch rate of lightly doped silicon in this solution is about 2500Å/minute whereas the etch rate of heavily boron doped silicon and SiGe is about 30Å/minute.

9. The etch stop layer 15 is removed by wet or dry etching, see FIG. 5. In this example, the layer 15 is etched by plasma etching in a $SF_6$/$C_2ClF_5$ environment using a power content of about 0.25Watts/cm$^2$ for about 25 minutes.

The intermediate layer 16 is removed using the same selective etch of 3:1 KOH with Isoproponal added above liquid solubility as mentioned in paragraph 8. The second etch stop layer 17 is removed with a 5:1:1 $H_2O$:$H_2O_2$:$NH_4OH$ if the etch stop is SiGe, and in the case of a boron etch stop, the etch stop layer may be removed by plasma etching or by wet etching.

10. If the final surface of the thin silicon layer 11 is rough, it may be smoothed by excimer laser scanning with sufficient energy to partially melt the silicon layer, whereby the films will solidify with a very smooth surface. For example, an XeCl laser beam having a pulse energy in the range of 0.2J/cm$^2$–1.0J/cm$^2$ adjusted to melt the silicon surface without melting the remaining silicon may be scanned across the layer.

The process for fabricating the FIG. 7 embodiment includes the operation sequence utilized in producing the FIG. 1 embodiment, and thereafter incorporates an operational sequence to produce electrical contacts to the buried components, such as components 12 and 13 of the FIG. 1 embodiment. As shown in FIG. 7, this embodiment comprises a glass wafer 20 having a thin silicon layer 21 in which doped buried components, such as collectors, indicated at 22 and 23, with electrical contacts 24 and 25 for components 22 and 23, respectively, are formed in the silicon layer 21.

Figure 8:
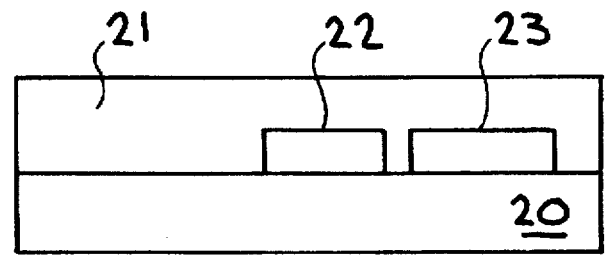
FIGS. 8–10 illustrate an example of the operational sequence of the fabrication method for producing the FIG. 7 embodiment, pursuant with the present invention.
Figure 9:
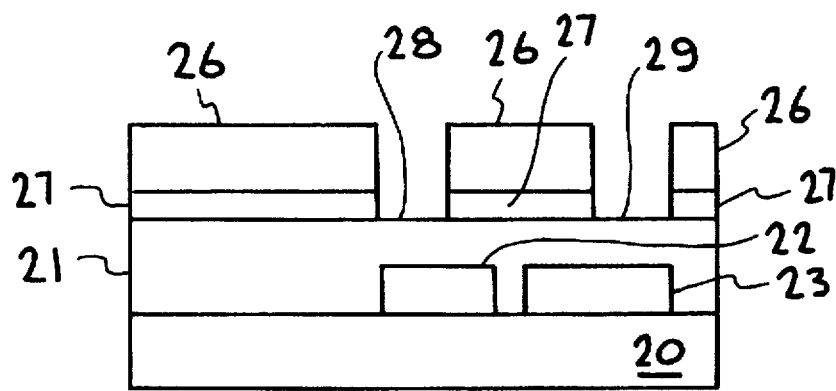
Figure 10:
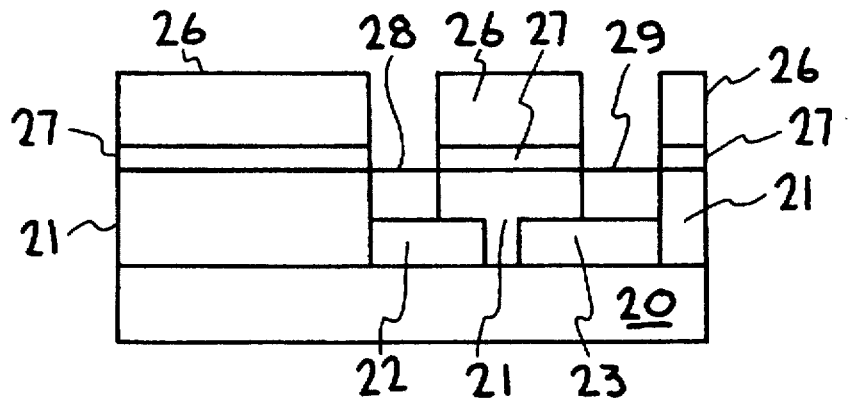

An example of the operational sequence for the method of producing the FIG. 7 embodiment is set forth with respect to FIGS. 8–10 as follows:

1. A glass wafer 20 having a thin layer 21 of silicon bonded thereto and containing patterned buried components 22 and 23, as shown in FIG. 8, may be formed by the process described above with respect to FIGS. 2–6.

2. A low temperature oxide 27 is deposited over the surface of layer 21 followed by the masking metal layer 26 which is most commonly aluminum. The thickness of metal required will depend on the expected energy to be applied to the silicon surface. 4000Å will suffice for about 1000Å silicon melt depth. Patterning and etching of the metal and oxide is performed opening areas over the buried regions.

3. Directing excimer laser energy onto exposed areas 28 and 29 whereby the thin silicon layer is melted beyond the topmost surface of layer 22 and 23, causing redistribution and activation of the dopant in the melted portions of 22 and 23 in contact regions 24 and 25, as seen in FIG. 10.

4. The maskant 26 may be removed by the appropriate metal etch and the oxide 27 may be removed by HF, thereby producing the embodiment of FIG. 7.

It has thus been shown that the present invention provides a method for forming buried components in a silicon-on-glass substrate, and additionally provides a method for forming electrical contacts for the buried components. While the above described examples have utilized glass as the insulator material, other insulating materials may be used, such as oxidized silicon wafers.

While particular embodiments, sequence of operation, materials, thicknesses, energies, laser types, etc., having been described and/or illustrated to explain the principles of this invention, such is not intended to limit the scope of the invention. Modifications and changes will become apparent to those skilled in the art, and it is intended that the invention be limited only by the scope of the appended claims.

I claim:

1. A silicon-on-insulator member having at least one component buried under a surface of the silicon consisting of:

an insulator substrate;

at least one layer of silicon;

at least one buried region in an outer surface region of said one layer of silicon;

said at least one buried region and said outer surface of said one layer of silicon being contiguous with a surface of the insulator substrate; and an electrical contact formed in said one layer of silicon so as to contact the buried region.

2. The silicon-on-insulator member of claim 1, wherein the insulator substrate is composed of glass.

3. A silicon-on-insulator member having at least one component buried under a surface of the silicon consisting of:

an insulator substrate;

at least one layer of silicon;

a plurality of buried regions in an outer surface of said one layer of silicon;

said plurality of buried regions being directly contiguous with a surface of the insulator substrate; and at least one electrical contact for at least one of said buried regions.

4. The silicon-on-insulator member of claim 3, wherein said insulator substrate is composed of glass.

5. The silicon-on-insulator member of claim 3, additionally including a smooth exposed surface of said one silicon layer.

6. The silicon-on-insulator member of claim 3, wherein said buried regions are composed of doped silicon.

7. A silicon-on-insulator member having at least one component buried under a surface of the silicon consisting of:

an insulator substrate;

at least one layer of silicon;

at least one buried region in an outer surface region of said one layer of silicon;

said at least one buried region and said outer surface of said one layer of silicon being contiguous with a surface of the insulator substrate;

said buried region being composed of doped silicon.

8. A silicon-on-insulator member having a plurality of buried components, consisting of:

a glass substrate;

at least one layer of material on said glass substrate;

said at least one layer of material including a silicon layer having surface regions thereof adjacent a surface of the glass substrate;

a plurality of components buried in said silicon layer, said components having a surface thereof adjacent said surface of the glass substrate;

at least of said buried components being composed of doped silicon.

9. The silicon-on-insulator member of claim 8, wherein an outer surface of said one silicon layer being smoothed by melting and then recrystallization of said outer surface.

10. The silicon-on-insulator member of claim 8, wherein selected buried components are provided with an electrical contact.

11. The silicon-on-insulator member of claim 10, wherein said electrical contact is composed of activated and doped silicon.

* * * * *